United States Patent
Goux et al.

(10) Patent No.: US 8,526,225 B2
(45) Date of Patent: Sep. 3, 2013

(54) NON-VOLATILE MEMORY DEVICE

(75) Inventors: Ludovic Goux, Hannut (BE); Judit G. Lisoni Reyes, Oud-Heverlee (BE); Thomas Gille, Leuven (BE); Dirk J. C. C. M. Wouters, Heverlee (BE)

(73) Assignee: NXP B.V., Eindhoven (NL)

( * ) Notice: Subject to any disclaimer, the term of this patent is extended or adjusted under 35 U.S.C. 154(b) by 658 days.

(21) Appl. No.: 12/596,721

(22) PCT Filed: Apr. 30, 2008

(86) PCT No.: PCT/IB2008/051682
§ 371 (c)(1),
(2), (4) Date: Oct. 28, 2009

(87) PCT Pub. No.: WO2008/132701
PCT Pub. Date: Nov. 6, 2008

(65) Prior Publication Data
US 2010/0202193 A1    Aug. 12, 2010

(30) Foreign Application Priority Data
May 1, 2007    (EP) .................................... 07107294

(51) Int. Cl.
*G11C 11/00*    (2006.01)
(52) U.S. Cl.
USPC ............... 365/163; 365/148; 365/174; 257/2; 257/4
(58) Field of Classification Search
USPC ..................... 365/163, 148, 174; 257/2, 4
See application file for complete search history.

(56) References Cited

U.S. PATENT DOCUMENTS

| | | |
|---|---|---|
| 5,166,758 A | 11/1992 | Ovshinsky et al. |
| 6,831,856 B2 | 12/2004 | Pashmakov |

(Continued)

FOREIGN PATENT DOCUMENTS

| | | |
|---|---|---|
| DE | 102005003675 A1 | 11/2005 |
| EP | 1501124 A | 1/2005 |
| EP | 1643508 A2 | 4/2006 |

OTHER PUBLICATIONS

Lankhorst, M.H.R., et al; "Low-Cost and Nanoscale Non-Volatile Memory Concept for Future Silicon Chips"; Nature Materials, 4; pp. 347-352; 2005.

Kozicki, M. N., et al; "Nanoscale Memory Elements Based on Solid-State Electrolytes"; IEEE Transactions on Nanotechnology, 4; pp. 331-338; 2005.

Kozicki, M.N., et al; "Programmable Metallization Cell Memory Based on Ag—Ge—S and Cu—Ge—S Solid Electrolytes"; 2005 Non-Volatile Memory Technology Symposium; Nov. 7-10, 2005; Dallas, TX, US; pp. 83-89; XP010854251; ISBN 0-7803-9408-9.

(Continued)

*Primary Examiner* — Vu Le
*Assistant Examiner* — Han Yang

(57) ABSTRACT

A memory device comprises an array of memory cells for storing data and a voltage application unit for applying voltages to the cells for writing data to the cells. Each memory cell has a first layer comprising copper in contact with a second layer comprising a chalcogenide material. The voltage application unit is arranged to write data by switching each cell between a first resistance state and a second, lower, resistance state. The voltage application unit is arranged to switch a cell to the first resistance state by applying a potential difference across the first and second layers such that the potential at the first layer is higher than the potential at the second layer by 0.5 volts or less. The voltage application unit is arranged to switch a cell to the second resistance state by applying a potential difference across the first and second layers such that the potential at the second layer is higher than the potential at the first layer by 0.5 volts or less. The current flow when switching between resistance states is less than 10 µA. The memory cells of the device can be toggled between the resistance states, and the resistance states are non-volatile.

20 Claims, 3 Drawing Sheets (a)

(b)

(56) References Cited

U.S. PATENT DOCUMENTS

| | | |
|---|---|---|
| 2002/0168820 A1 | 11/2002 | Kozicki et al. |
| 2003/0045049 A1 | 3/2003 | Campbell et al. |
| 2004/0113232 A1 | 6/2004 | Johnson et al. |
| 2004/0124407 A1 | 7/2004 | Kozicki et al. |
| 2004/0202017 A1 | 10/2004 | Lee |
| 2005/0121697 A1 | 6/2005 | Ishida et al. |
| 2005/0226062 A1 | 10/2005 | Aratani et al. |
| 2006/0076413 A1 | 4/2006 | Kund et al. |
| 2006/0077741 A1 | 4/2006 | Wang et al. |
| 2006/0110878 A1 | 5/2006 | Lung et al. |
| 2006/0118913 A1* | 6/2006 | Yi et al. .................. 257/613 |
| 2007/0200108 A1* | 8/2007 | Noh et al. .................. 257/4 |
| 2008/0314739 A1* | 12/2008 | Gopalakrishnan et al. .................. 204/247.4 |
| 2009/0194755 A1* | 8/2009 | Lung .................. 257/2 |

OTHER PUBLICATIONS

Sakamoto, T., et al; "Nanometer-Scale Switches Using Copper Sulfide"; Aplied Physics Letters; vol. 82, No. 18; May 5, 2003; pp. 3032-3034; XP012033941; ISSN: 0003-6951.

Wang, Z., et al; "Resistive Switching Mechanism in ZnxCd1-xS Nonvolatile Memory Devices"; IEEE Electron Device Letters, vol. 28, No. 1; Jan. 2007; pp. 14-16; XP011147434; ISSN: 0741-3106.

Cardoso, S., et al; "Double-Barrier Magnetic Tunnel Junctions With GeSbTe Thermal Barriers for Improved Thermally Assisted Magnetoresistive Random Access Memory Cells"; Journal of Applied Physics 99; Apr. 19, 2006; 3 Pages.

\* cited by examiner

NON-VOLATILE MEMORY DEVICE

This invention relates to a non-volatile memory device. In particular, this invention relates to a non-volatile memory device comprising a chalcogenide material sandwiched between a pair of electrodes, which stores information by a resistive-switching technique.

The current market for non-volatile memory devices is dominated by flash memory devices. These devices store information in an array of memory cells, each comprising a floating gate transistor. As the memory density of flash memory devices is increased, so the size of individual memory cell size of the devices falls. It is expected that flash memory devices will face scaling problems beyond the 45 nm technology node due to fundamental physical limitations. The write speed and durability of flash memory devices may also be limited by design constraints.

An emerging memory technology which is currently seen as having the potential to overcome the above mentioned limitations of flash memory devices is resistive-switching memory technology. Resistive-switching memory devices store information by inducing changes in the resistance of an active material, usually through the application of specific currents or voltages.

A known active material suitable for use in resistive-switching memory devices is chalcogenide glass. A memory device employing this active material comprises an array of memory cells, each comprising chalcogenide glass sandwiched between a pair of electrodes. Information may be stored in a cell of the device by applying current-induced heat to switch the chalcogenide material from a low resistance, crystalline state to a high resistance, amorphous state. The material may be switched back to the crystalline state by the application of a threshold voltage. This device is also known as a phase-change memory device.

The known resistive-switching memory device described above is thought to be relatively scalable because of low voltage operation, which is in the order of 1 to 2 volts, and because higher memory densities are expected to require lower switching currents. In recent prototypes down to the 90 nm technology node, the switching current has been reported to be in the range of a few hundred micro-amperes. However, it is still to be demonstrated whether the switching current can be reduced far below 100 µA.

Another emerging memory technology which offers an alternative to flash memory technology is programmable metallisation cell (PMC) memory technology. The memory switching mechanism in this technology is the electrolytic formation and rupture of a conductive filament. It has been demonstrated that that a memory cell using this technology can be switched by the application of 0.2 volts with a current as low as 10 µA. This technology is expected to be scalable provided that the density of the filaments can be controlled. However, there are a number of problems associated with programmable metallisation cell memory technology, specifically relating to its ability to retain data in a stable manner over time.

In this context, there remains a need for a reliable resistive-switching memory device having small switching current and voltage requirements.

According to a first aspect of the invention, there is provided a memory device comprising an array of memory cells for storing data and a voltage application unit for applying voltages to the cells for writing data to the cells, wherein each memory cell has a first layer comprising copper in contact with a second layer comprising a chalcogenide material, wherein the voltage application unit is arranged to write data by switching each cell between a first resistance state and a second lower resistance state, wherein the voltage application unit is arranged to switch a cell to the first resistance state by applying a potential difference across the first and second layers such that the potential at the first layer is higher than the potential at the second layer by 0.5 volts or less, and wherein the voltage application unit is arranged to switch a cell to the second resistance state by applying a potential difference across the first and second layers such that the potential at the second layer is higher than the potential at the first layer by 0.5 volts or less.

The inventors have discovered that, when copper is placed in contact with a chalcogenide material, the bi-material stack can be switched between different resistance states by applying low voltages of opposite polarities across the materials. Without being bound by theory, it is believed that an interfacial layer is created between the materials, and this interfacial layer has a relatively high resistance which is switchable between two values, depending on the polarity of the applied voltage.

The invention thus provides a memory device which operates with low switching voltages, specifically less than 0.5 volts or less. The switching voltages are thus significantly less than those of known phase-change memories, in which a chalcogenide material is switched between a high resistance, amorphous state and a low resistance crystalline state.

The switching mechanism of the inventive memory device is also believed to be entirely different to that of programmable metallisation cells, in that operation of the memory device according to the invention is believed to involve the formation of an interfacial layer having a switchable resistance. Both resistance states of the invention have been found to involve significantly higher resistances than those of the chalcogenide material on which the device is based. In contrast, the switching mechanism of a programmable metallisation cell involves the electrolytic formation of a conductive filament within an inter-electrode material. As such, one of the resistance states of a programmable metallisation cell involves a relatively low resistance which is significantly lower than the normal resistance of the inter-electrode material.

The voltage application unit is preferably arranged to switch between the first and second resistance states by applying positive or negative potentials to the copper layer and holding the chalcogenide material layer at 0 volts.

A number of arrangements for each memory cell are possible, provided that they have the above-described first and second layers in contact with one another. For example, the first layer may act as a first electrode for applying voltages, and each memory cell may then further comprise a second electrode formed on a surface of the second layer that is not in contact with the first electrode. In this case, the second electrode is preferably a metallic electrode such as tungsten.

Alternatively, each memory cell may further comprise a first electrode formed on a surface of the first layer that is not in contact with the second layer and a second electrode formed on a surface of the second layer that is not in contact with the first layer. In this case, one or both of the first and second electrodes is preferably a metallic electrode such as tungsten.

The second layer preferably comprises a metal-doped SbTe chalcogenide material, although other chalcogenide materials may of course be employed. The chalcogenide material of the second layer should be substantially, preferably entirely, in the amorphous state.

As described above, each cell may be switched between the first and second resistance states by applying voltages of 0.5 volts or less of opposite polarities to the first layer. However, it has been discovered that significantly lower switching voltages can be used, for example, preferably 0.4 volts or less, more preferably 0.3 volts or less, and most preferably 0.25 volts or less.

The voltage application unit is preferably arranged to provide the voltages with a maximum current flow of about 10 μA or less. As such, the memory device has very low power consumption.

In embodiments, in each of the first and second resistance states, the resistance across the first and second layers of each memory cell is higher than the sum of the resistances of the first and second layers when considered in isolation.

According to a second aspect of the invention, there is provided a method of writing data to a memory device, the memory device comprising an array of memory cells for storing data, each memory cell having a first layer comprising copper in contact with a second layer comprising a chalcogenide material, wherein the method comprises: switching a cell to a first resistance state by applying a potential difference across the first and second layers such that the potential at the first layer is higher than the potential at the second layer by 0.5 volts or less; and switching a cell to a second resistance state by applying a potential difference across the first and second layers such that the potential at the second layer is higher than the potential at the first layer by 0.5 volts or less, wherein the second resistance state is a lower resistance state than the first resistance state.

The method according to the invention may relate to the operation of the memory device described above. In particular, the potential differences may be applied across the first and second layers by a voltage application unit.

In the method, the chalcogenide material of the second layer is preferably substantially in the amorphous state in both the first and second resistance states. As such, both resistance states involve relatively high resistances.

In a preferred embodiment, the steps of switching a cell to the first and second resistance states comprises applying potential differences of 0.25 volts or less across the first and second layers. A current passing through the first and second layers is preferably 10 μA or less. As such, the method involves very low power consumption.

Preferred embodiments of the invention will now be described, by way of example only, with reference to the accompanying drawings, in which.

The invention provides a memory device comprising an array of memory cells for storing data and a voltage application unit for applying voltages to the cells for writing data to the cells. In the device, each memory cell comprises a first layer formed of copper and a second layer formed of a chalcogenide material in contact with each other. The voltage application unit is arranged to write data to a cell by switching the cell between a first resistance state and a second lower resistance state.

Switching to the first resistance state is achieved by applying a potential difference across the first and second layers such that the potential at the first layer is higher than the potential at the second layer by 0.5 volts or less. Switching to the second resistance state is achieved by applying a potential difference across the first and second layers such that the potential at the second layer is higher than the potential at the first layer by 0.5 volts or less.

It has been found that, in embodiments, voltages of as low as 0.2 volts are sufficient to switch between the resistance states. Combined with a very small current flow, this results in a low power consumption memory.

Figure 1:
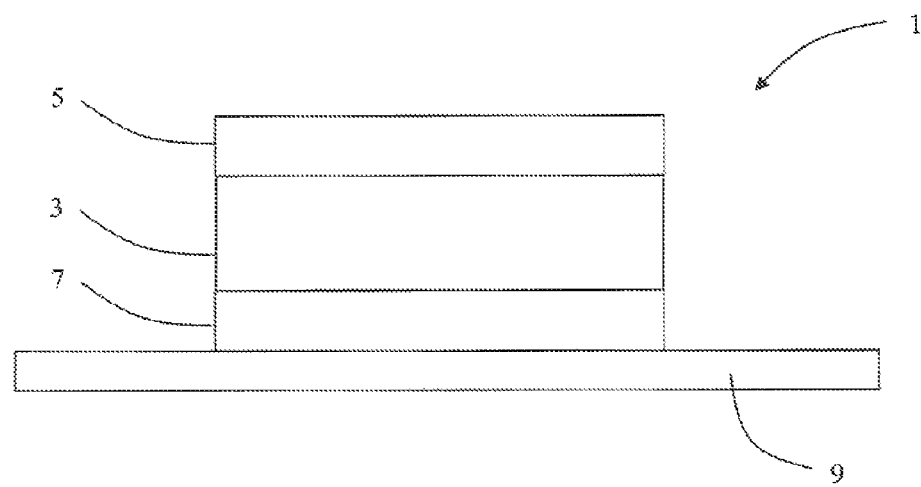
FIG. 1 is a schematic view for use in explaining an embodiment of a memory device according to the invention.

FIG. 1 shows a configuration of a memory cell 1 of a memory device according to a first embodiment of the invention. Although it is not shown in the figure, the memory device includes a plurality of the illustrated memory cells 1, together with a voltage application unit for applying predetermined voltages to the memory cells 1.

With reference to the Figure, the memory cell 1 comprises a metal-doped SbTe chalcogenide material layer 3, sandwiched between first and second electrode layers 5, 7.

Metal-doped SbTe chalcogenide materials will be known to those skilled in the art, and are described in more detail in M. H. R. Lankhorst et al.: "Low-cost and Nanoscale Non-volatile Memory Concept for Future Silicon Chips", Nature Materials, 4, 347-352 (2005), the entire contents of which are incorporated herein by reference. The chalcogenide material layer 3 is in the amorphous state.

The first, upper electrode 5 is formed of copper and the second, lower electrode 7 is formed of tungsten. The first and second electrodes 5, 7 are in direct contact with opposite surfaces of the chalcogenide material layer 3, and face each other.

The entire memory cell 1 is formed on a silicon substrate 9, on which the rest of the memory device is also based. Although not shown in the Figure, various layers are provided between the substrate 9 and first electrode 5. These layers may include a $SiO_2$ insulating layer and a tungsten based connection to an underlying MOS or bipolar transistor. A suitable underlying structure will be known to those skilled in the art.

The voltage application unit of the memory device (not shown) is arranged to apply the predetermined voltages across the first and second electrodes 5, 7.

Figure 2:
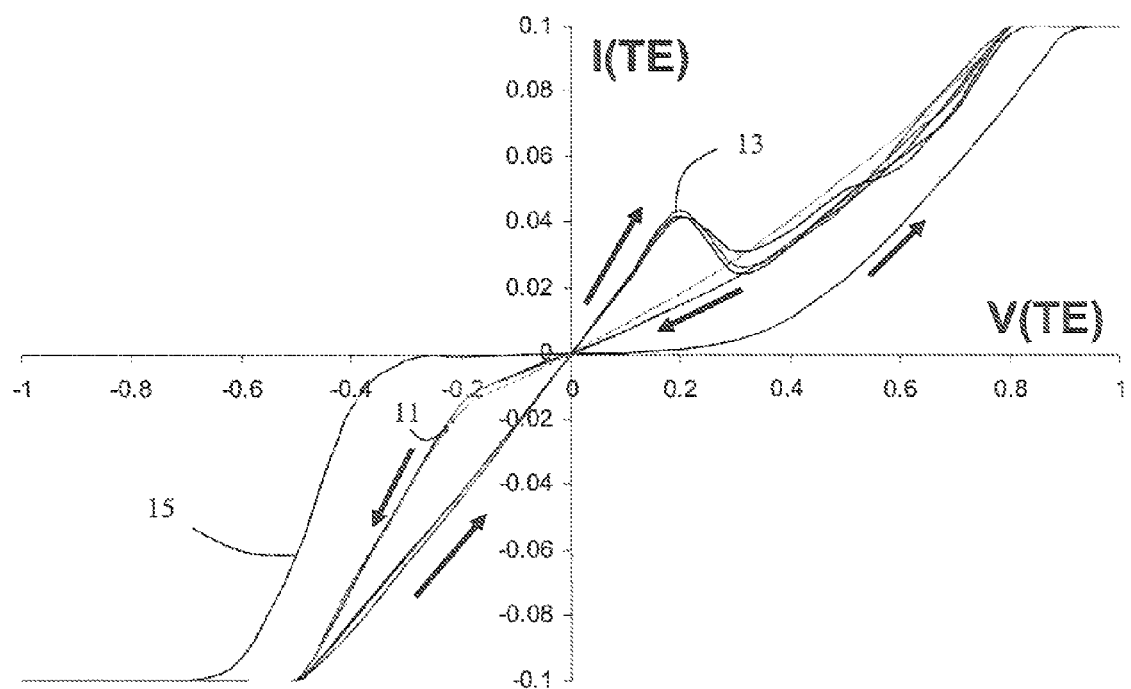
FIG. 2 is a plot showing the current-voltage characteristic of a memory cell shown in FIG. 1.

FIG. 2 is a plot showing the current-voltage characteristic of the memory cell 1 shown in FIG. 1, as measured across the electrodes 5, 7. The voltages indicated are those applied to the first, upper electrode 5 while the other electrode 7 is at 0 volts.

With reference to the Figure, it can be seen that the memory cell 1 has three different "resistance states" 11, 13, 15 having different current-voltage characteristics. The first and second resistance states 11, 13 have a similar characteristic above positive voltages of 0.3 volts, but at the other indicated voltages the first resistance state 11 generally exhibits a higher resistance than the second resistance state 13. The third resistance 15 state is distinct at all indicated voltages, and generally exhibits the highest resistance of the three states.

Initially, the memory cell 1 is in either the first resistance state 11 or the third resistance state 15. The third resistance state 15 is not utilised by the invention. If the cell 1 is found to be in the third resistance state 15, it is switched to the first resistance state 11 by applying a voltage of just under 1 volt to the first electrode 5. The process is known as a "forming" step and is only performed once, in order to render the memory cell 1 ready for use in writing and reading data.

In use the, data is written to the memory cell 1 by switching it between the first and second resistance states 11, 13. Typically, the first resistance state 11 represents a stored binary "1" and the second resistance state 13 represents a stored binary "0".

The memory cell 1 is switched from the first state 11 to the second state 13 by applying a voltage of minus 0.2 volts to the first electrode 5. The memory cell 1 is switched from the second state 13 to the first state 11 by applying a voltage of plus 0.2 volts to the first electrode 5. The memory cell 1 may be repeatedly cycled between the first and second resistance states 11, 13, and the states have been found to be non-volatile.

The detailed mechanism by which the different resistance states are formed is not yet full understood. However, it is believed that a high-resistance interfacial layer may be formed between the copper of the first electrode 5 and the chalcogenide material layer 3, i.e. in series with the layers. Further, it is believed that the application of small voltages of opposing polarities may be sufficient to cause oxidisation and reduction at the interfacial layer. In any case, it has been found that the resistance of the memory cell in both the first and second resistance states 11, 13 is higher than the sum of the resistances of the first electrode 5 and the chalcogenide material layer 3 when separated from each other.

Alternatively, it is possible that the copper of the first electrode 5 and the chalcogenide material layer 3 interact to form a trap-rich interfacial layer. The application of small voltages of opposing polarities may then control the filling and emptying of the traps, thereby controlling the resistance of the interfacial layer.

Figure 3:
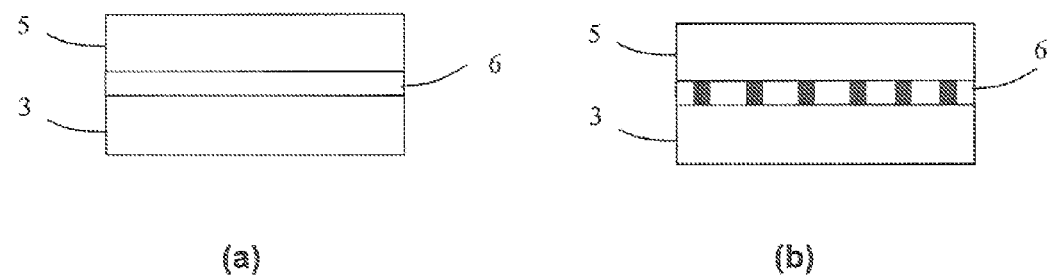
FIG. 3 is a schematic view for explaining a possible mechanism underlying the memory device according to the invention.

As a further alternative, it is possible that a high resistance interfacial layer formed between the copper of the first electrode 5 and the chalcogenide material layer 3 experiences the formation and rupture of conductive filaments. This mechanism is schematically illustrated in FIG. 3.

In FIG. 3(a), the homogeneous interfacial layer 6 of the memory cell exhibits a relatively high resistance. In FIG. 3(b), conductive filaments are formed in the interfacial layer 6, thereby lowering its resistance. The resistance of the interfacial layer 6 is controlled by forming or rupturing the filaments. In both (a) and (b), the interfacial layer 6 is arranged in series with the chalcogenide material layer 3, with the chalcogenide material layer 3 thereby contributing to the resistance of the memory cell in both states.

In use, data is read from the memory cell 1 by applying small voltages (of less than the switching voltages) across the electrodes 5, 7. The current is then sensed, amplified and measured to determine which of the resistance states the memory cell 1 is in. The reading voltages do not affect the resistance state of the memory cell 1 because they are small.

A method of forming the memory cell 1 shown in FIG. 1 will now be briefly explained with reference to FIG. 4. The memory cell 1 can be formed using a variety of conventional semiconductor processing techniques, by which high memory cell densities may be achieved. Techniques disclosed in Kozicki et al: "Nanoscale memory elements based on Solid-state Electrolytes", IEEE Transactions on Nanotechnology, 4, 331-338 (2005) for forming programmable metallization cells, the entire contents of which are incorporated herein by reference, are particularly suitable.

The memory cell 1 is typically formed over an MOS or bipolar transistor, which is provided for switching purposes. Those skilled in the art will be familiar with the formation of these types of transistors in memory devices, and a detailed description of the formation of the transistor will not therefore be provided.

Figure 4:
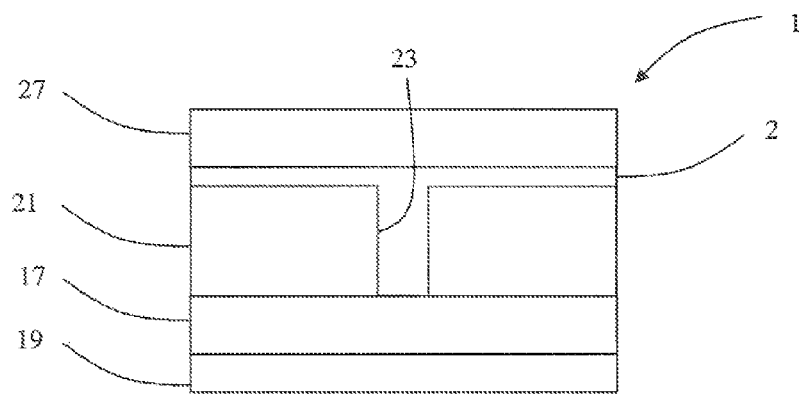
FIG. 4 is a schematic view for explaining a method of forming the memory cell shown in FIG. 1.

Following the formation of the transistor for a memory cell, as described above, a connection in the form of a tungsten layer 17 is formed over an $SiO_2$ insulating layer 19, as shown in FIG. 4. The tungsten connection 17 is formed by depositing tungsten directly on the insulating layer 19 using a chemical vapour deposition (CVD) process, followed by chemical mechanical polishing (CMP). The tungsten connection 17 can take the form of a plug or a line.

Next, a dielectric stack 21 is deposited on the tungsten layer 17. The dielectric stack 21 may be formed of a typical SiC or $SiO_2$ stack used in back-end-of-line processing.

Following deposition of the dielectric stack 21, a hole 23 is opened in the stack 21 by dry etching. The hole 23 is opened sufficiently deep to expose the tungsten layer 17 underneath the dielectric stack 21. The hole 23 may, for example, have a diameter of 40 nm.

After the hole 23 has been opened, a chalcogenide material 25 is deposited in the hole 23 and over the dielectric stack 21. The chalcogenide material 25 is deposited by sputtering at room temperature. The chalcogenide material 25 may, however, alternatively be deposited by conformal chemical vapour deposition or atomic-layer deposition techniques. The chalcogenide material 25 may then be planarized down to the dielectric stack 21.

Following deposition of the chalcogenide material 25, a copper layer 27 is deposited on the chalcogenide material 25 by sputtering. The chalcogenide material 25 and the copper layer 27 are then patterned in a low temperature process to form a top electrode connection.

Figure 5:
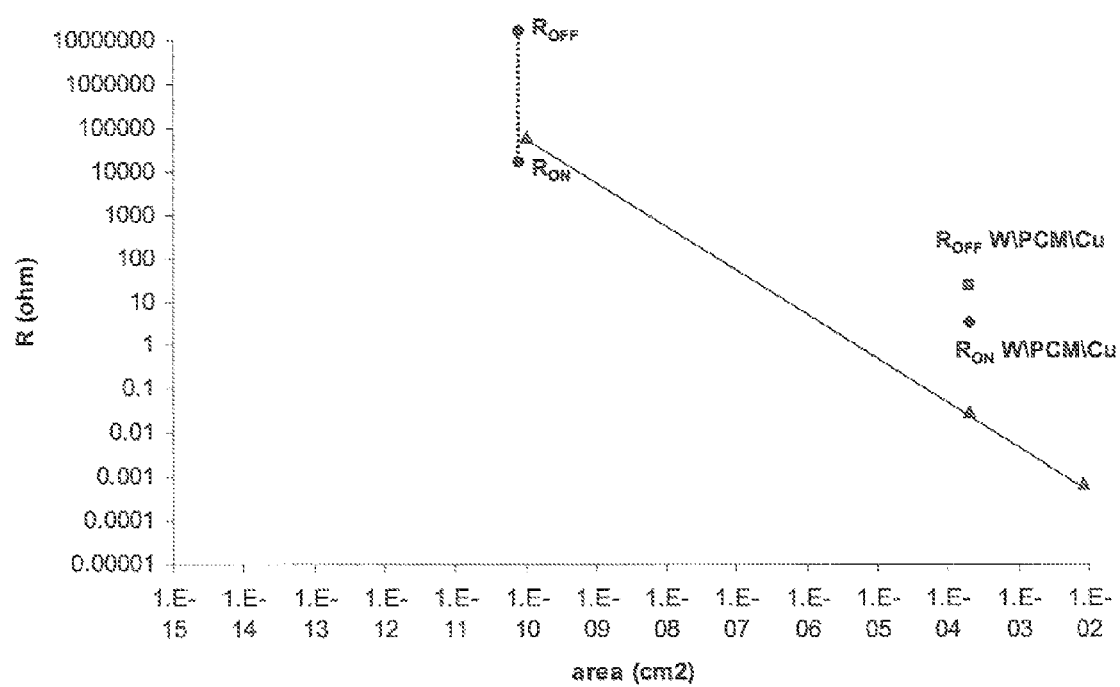
FIG. 5 is a plot showing how the resistance of the memory cell shown in FIG. 1 scales with cell size.

The resultant memory cell 1, as shown in FIG. 4, may be formed with a very small size. FIG. 5 shows how the resistance of the memory cell shown in FIGS. 1 and 4 scales with cell size.

In the Figure, cell resistance is plotted against cell size. The square and diamond-shaped points represent measured values for the first and second resistance states of memory cells according to the invention. The triangle-shaped points represent the theoretical resistance values for the amorphous chalcogenide material in isolation which, for a given cell size, has a lower resistance than either of the resistance states of the memory cell according to the invention.

It can been seen in the Figure that resistance of the chalcogenide material increases as cell size decreases. This trend in resistance is predicted to be the same for the resistance states of the memory cell according to the invention.

For comparison purposes, the resistances of the two states of a programmable metallization cell having a cell size of 40 nm are also shown in the Figure as circle-shaped points.

It can be seen that, at a cell size of 40 nm, the resistance of the amorphous chalcogenide material in isolation is slightly greater than that of the lower resistance state of the programmable metallization cell. As noted above, for a given cell size, both of the resistance states of the memory cell according to the invention have a greater resistance than that of the chalcogenide material in isolation. The resistance of the lower resistance state of the memory cell according to the invention is therefore expected to be greater than that of the lower resistance state of the programmable metallization cell. Accordingly, it is expected that, for a given cell size, the memory cell according to the invention will have a lower current flow, and thus lower power consumption, than that of the programmable metallization cell.

As described above the invention provides a memory device having an array of memory cells which may be provided at a high density. Data is stored in the memory cells by switching the cells between two high resistance states. The switching is performed using low voltages and low currents, and the power consumption of the memory is therefore low.

Preferred embodiments of the invention have been described above. However, it will be apparent to the skilled person that various changes and modifications may be made without departing from the scope of the invention as defined by the claims.

For example, the memory cells may have various alternative structures to those described above, as long as there is a copper layer in contact with an amorphous chalcogenide material.

A single method for forming a memory cell according to the invention as been described above, but other suitable methods will be known to the skilled person. For example, in a double damascene scheme, a double insulator stack could be realised, after which a hole could be opened for the chalcogenide material, together with a trench for a copper electrode.

The invention has been described above as relating to memory device having cells in which a copper layer or electrode is in contact with a chalcogenide material layer. However, other metals may be used instead of copper. It is believed that oxidisable metals such as Ti, Ta, Al, Ni are suitable.

The invention claimed is:

1. A memory device comprising:
   an array of memory cells for storing data, each memory cell having a first layer comprising copper in contact with a second layer comprising a chalcogenide material, the second layer including an interfacial layer in contact with the first layer; and
   a voltage application unit configured and arranged with the interfacial region to
      write data by switching the interfacial layer in each cell between a first resistance state and a second lower resistance state by applying a voltage to each cell and using the applied voltage to trap carriers within the interfacial layer, the trapped carriers setting the resistance of the interfacial layer to a resistance that is different than a resistance of a portion of the second layer that does not include the interfacial layer,
      switch one of the cells to the first resistance state by applying a potential difference across the first and second layers such that the potential at the first layer is higher than the potential at the second layer by about 0.5 volts or less, and
      switch one of the cells to the second resistance state by applying a potential difference across the first and second layers such that the potential at the second layer is higher than the potential at the first layer by about 0.5 volts or less.

2. A memory device according to claim 1, wherein
   the first layer is a first electrode,
   each memory cell further comprises a second electrode formed on a surface of the second layer that is not in contact with the first electrode.

3. A memory device according to claim 2, wherein the second electrode comprises tungsten.

4. A memory device according to claim 1, wherein each memory cell further comprises a first electrode formed on a surface of the first layer that is not in contact with the second layer and a second electrode formed on a surface of the second layer that is not in contact with the first layer.

5. A memory device according to claim 2, wherein one or both of the first and second electrodes comprises tungsten.

6. A memory device according to claim 1, wherein the second layer comprises a metal-doped SbTe chalcogenide material.

7. A memory device according to claim 1, wherein the chalcogenide material of the second layer is substantially in an amorphous state.

8. A memory device according to claim 1,
   wherein the voltage application unit is arranged to switch a cell to the first resistance state by applying the potential difference across the first and second layers such that the potential at the first layer is higher than the potential at the second layer by about 0.25 volts or less, and
   wherein the voltage application unit is arranged to switch a cell to the second resistance state by applying the potential difference across the first and second layers such that the potential at the second layer is higher than the potential at the first layer by about 0.25 volts or less.

9. A memory device according to claim 1, wherein the voltage application unit is arranged to provide a maximum current of about 10 µA or less.

10. A memory device according to claim 1, wherein, in each of the first and second resistance states, the resistance across the first and second layers of each memory cell is higher than the sum of the resistances of the first and second layers when considered in isolation.

11. A method of writing data to a memory device, the memory device comprising an array of memory cells for storing data, each memory cell having a first layer comprising copper in contact with a second layer comprising a chalcogenide material and an interfacial layer in contact with the first layer, wherein the method comprises:
    using an applied voltage to trap carriers within the interfacial layer, the trapped carriers setting a resistance of the interfacial layer to a resistance that is different than a resistance of a portion of the second layer that does not include the interfacial layer; switching an interfacial layer of one of the cells to a first resistance state by applying a potential difference across the first and second layers such that the potential at the first layer is higher than the potential at the second layer by about 0.5 volts or less; and
    switching the interfacial layer of the cell to a second resistance state, which has a lower resistance state than the first resistance state, by applying a potential difference across the first and second layers such that the potential at the second layer is higher than the potential at the first layer by about 0.5 volts or less.

12. A method according to claim 11, wherein the chalcogenide material of the second layer is substantially in an amorphous state in the first and second resistance states.

13. A method to claim 11, wherein the step of switching a cell to the first resistance state comprises applying the potential difference across the first and second layers such that the potential at the first layer is higher than the potential at the second layer by about 0.25 volts or less, and
    wherein the step of switching a cell to the second resistance state comprises applying the potential difference across the first and second layers such that the potential at the second layer is higher than the potential at the first layer by about 0.25 volts or less.

14. A method to claim 11, wherein the steps of switching the cell to the first and second resistance states comprise providing a maximum current of about 10 µA or less through the first and second layer.

15. A memory device according to claim 1, wherein the interfacial has a resistance that is higher than a resistance of the first layer and being configured and arranged to switch between the first and second resistance states in response to the potential difference.

16. A memory device according to claim 1, wherein the interfacial layer is configured and arranged to switch between the first and second resistance states by at least one of
    trapping carriers based upon the potential difference, and
    forming and rupturing conductive filaments.

17. A memory device according to claim 1, wherein the chalcogenide material of the second layer in each cell is configured and arranged to remain substantially in an amorphous state when the cell is in either the first or second resistance states.

18. A method according to claim 11, wherein switching a cell to a first resistance state by applying a potential difference across the first and second layers includes switching the resistance of the interfacial layer by trapping carriers within the interfacial layer to set the resistance of the interfacial layer to a resistance that is different than the rest of the second layer.

19. A method according to claim 11, wherein switching a cell to a first resistance state by applying a potential difference across the first and second layers includes switching the resistance of the interfacial by at least one of: trapping and releasing carriers within the interfacial layer and forming and rupturing conductive filaments within the interfacial layer.

20. An apparatus comprising:
a plurality of memory cells, each cell having a first electrode including copper, a second electrode, a chalcogenide-based layer between the first and second electrodes, and an interfacial region between the first electrode and the chalcogenide-based layer, the interfacial region being configured and arranged to respond to a potential difference across the electrodes by at least one of: trapping and releasing carriers, and forming and rupturing conductive filaments; and
a voltage application unit configured and arranged with the interfacial region to, for each memory cell,
apply a potential difference across the electrodes to set a potential at the first electrode higher than a potential at the chalcogenide-based layer, to switch the interfacial region to a first resistance state, and
apply a potential difference across the electrodes to set a potential at the chalcogenide-based layer higher than a potential at the first electrode, to switch the interfacial region to a second resistance state that is lower than the first resistance state and in the case of trapping and releasing carriers, use the applied voltage to trap carriers within the interfacial region, the trapped carriers setting the resistance of the interfacial region to a resistance that is different than a resistance of a portion of the second electrode that does not include the interfacial region.

* * * * *